(12) United States Patent
Dosluoglu et al.

(10) Patent No.: US 7,238,993 B2
(45) Date of Patent: Jul. 3, 2007

(54) CMOS PIXEL WITH DUAL GATE PMOS

(75) Inventors: Taner Dosluoglu, New York, NY (US);
Nathaniel Joseph McCaffrey,
Stockton, NJ (US)

(73) Assignee: Dialog Imaging Systems GmbH,
Kirchheim, Teck-Nabern (DE)

( * ) Notice: Subject to any disclaimer, the term of this patent is extended or adjusted under 35 U.S.C. 154(b) by 329 days.

(21) Appl. No.: 11/068,283

(22) Filed: Feb. 28, 2005

(65) Prior Publication Data

US 2005/0156212 A1    Jul. 21, 2005

Related U.S. Application Data

(62) Division of application No. 10/339,190, filed on Jan. 9, 2003, now Pat. No. 6,870,209.

(51) Int. Cl.
*H01L 29/76* (2006.01)
(52) U.S. Cl. .............. 257/365; 257/290; 257/291; 257/E27.131; 257/E27.132
(58) Field of Classification Search ........ 257/290–293, 257/365
See application file for complete search history.

(56) References Cited

U.S. PATENT DOCUMENTS 5,191,398 A * 3/1993 Mutoh ................. 257/216
5,917,547 A   6/1999 Merrill et al. ........... 348/301
5,923,369 A   7/1999 Merrill et al. ........... 348/301

(Continued)

FOREIGN PATENT DOCUMENTS

EP     0 734 069 A2    9/1996

(Continued)

OTHER PUBLICATIONS

"A 128×128-Pixel Standard-CMOS Image Sensor with Electronic Shutter", by Chye Huat Aw et al., Solid-State Circuits Conf., 1996, Digest of Tech. Papers, 42nd ISSCC., Feb. 8, 1996, pp. 180-181, 140.

*Primary Examiner*—Dung A. Le
(74) *Attorney, Agent, or Firm*—Saile Ackerman LLC; Stephen B. Ackerman; Larry J. Prescott

(57) ABSTRACT

A pixel circuit with a dual gate PMOS is formed by forming two $P^+$ regions in an $N^-$ well. The $N^-$ well is in a $P^-$ type substrate. The two $P^+$ regions form the source and drain of a PMOS transistor. The PMOS transistors formed within the $N^-$ well will not affect the collection of the photo-generated charge as long as the source and drain potentials of the PMOS transistors are set at a lower potential than the $N^-$ well potential so that they remain reverse biased with respect to the $N^-$ well. One of the $P^+$ regions used to form the source and drain regions can be used to reset the pixel after it has been read in preparation for the next cycle of accumulating photo-generated charge. The $N^-$ well forms a second gate for the dual gate PMOS transistor since the potential of the $N^-$ well 12 affects the conductivity of the channel of the PMOS transistor. The addition of two NMOS transistors enables the readout signal to be stored at the gate of one of the NMOS transistors thereby making a snapshot imager possible. The circuit can be expanded to form two PMOS transistors sharing a common drain in the $N^-$ well.

9 Claims, 3 Drawing Sheets

U.S. PATENT DOCUMENTS

| | | |
|---|---|---|
| 5,952,686 A | 9/1999 | Chou et al. |
| 6,087,703 A | 7/2000 | Ohta et al. |
| 6,127,697 A | 10/2000 | Guidash ............... 257/292 |
| 6,147,362 A | 11/2000 | Keyser ............... 257/59 |
| 6,501,109 B1 | 12/2002 | Chi |

FOREIGN PATENT DOCUMENTS

| | | |
|---|---|---|
| EP | 0 886 318 A1 | 12/1998 |
| JP | 2000 253315 | 9/2000 |

* cited by examiner

CMOS PIXEL WITH DUAL GATE PMOS

This is a division of U.S. patent application Ser. No. 10/339,190, filing date Jan. 9, 2003, now U.S. Pat. No. 6,870,209 titled Cmos Pixel With Dual Gate Pmos, assigned to the same assignee as the present invention, which is herein incorporated by reference in its entirety.

BACKGROUND OF THE INVENTION (1) Field of the Invention

This invention relates to a CMOS pixel comprising an N⁻ well formed in a P⁻ epitaxial silicon layer with a dual gate PMOS transistors formed in the N⁻ well.

(2) Description of the Related Art

U.S. Pat. No. 6,147,362 to Keyser describes a high performance pixel for active matrix electronic displays. The pixel combines a compact mesa-isolated PMOS access transistor with a novel, area efficient high voltage device.

U.S. Pat. No. 6,127,697 to Guidash describes an active pixel sensor comprising a substrate of a first conductivity type having a surface containing PMOS and NMOS implants that are indicative of a sub-micron CMOS process, a photodetector formed at a first depth from an implant of a second conductivity type that is opposite the first conductivity type on the surface, and a gate on the surface adjacent to the photodetector. The photodetector is formed by an implant of the second conductivity type that is deeper and more lightly doped than implants used within the sub-micron CMOS process.

U.S. Pat. No. 5,923,369 to Merrill et al. describes an active pixel sensor cell array in which a differential amplifier amplifies the output of each cell. The output of the differential amplifier is fed back to one of its inputs. The use of the differential amplifiers reduces fixed pattern noise in the image data generated by reading the array.

U.S. Pat. No. 5,917,547 to Merrill et al. describes an active pixel sensor array in which a two stage amplifier amplifies the output of each cell. The two stage amplifier design reduces fixed pattern noise in the image data generated by reading the array.

SUMMARY OF THE INVENTION

Active pixel sensors, APS, are of particular value in digital imaging systems because they can be fabricated using standard CMOS, complimentary metal oxide semiconductor, processing and because they have lower power consumption than CCD, charge coupled device, imagers. As CMOS process parameters shrink, the analog performance of minimum size transistors deteriorates. It is desirable to have transistors in the semiconductor well forming the pixel which can be drawn to a size large enough to improve the analog performance without impacting the area under which signal-generated carriers, such as photo-generated carriers, will be generated. This is a problem using N⁺ regions with $V_{DD}$ bias acting as drains to form the pixel.

It is a principle objective of this invention to provide a CMOS pixel circuit formed in an N⁻ well with a dual gate PMOS, P channel metal oxide semiconductor, transistor formed in an N⁻ well wherein any of the P⁺ regions used to form the PMOS transistor can be used to reset the pixel.

It is another principle objective of this invention to provide a CMOS pixel circuit formed in an N⁻ well with a dual gate PMOS transistor formed in an N⁻ well with two NMOS, N channel metal oxide semiconductor, transistors used to read the pixel.

It is another principle objective of this invention to provide a CMOS pixel circuit formed in an N⁻ well with two dual gate PMOS transistors formed in an N⁻ well with four NMOS transistors used to read the pixel.

These objectives are achieved by forming an N⁻ well in a P⁻ epitaxial silicon layer. P⁺ regions are then formed in the N⁻ well to form the source and drain of a PMOS, P channel metal oxide semiconductor, transistor. The PMOS transistors formed within the N⁻ well will not affect the collection of signal generated carriers as long as the source and drain potentials of the PMOS transistors are set at a lower potential than the N⁻ well potential so that they remain reverse biased with respect to the N⁻ well. Typically, but not necessarily, the signal generated carriers are photo-generated carriers. Any of the P⁺ regions used to form the source and drain regions can be used to reset the pixel after it has been read in preparation for the next cycle of accumulating signal-generated carriers. The N⁻ well forms a second gate for the dual gate PMOS transistor since the potential of the N⁻ well 12 affects the conductivity of the channel of the PMOS transistor.

The drain of the PMOS transistor can be connected to ground potential and thereby require one less conducting line to operate each pixel.

DESCRIPTION OF THE PREFERRED EMBODIMENTS

Figure 1:
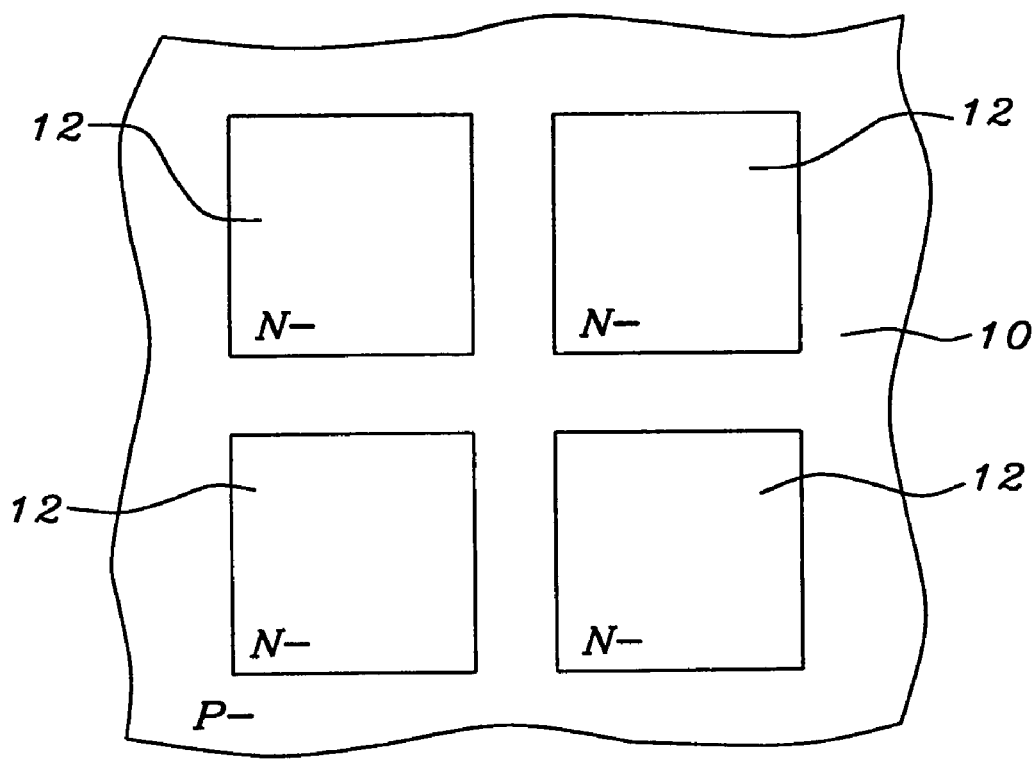
FIG. 1 shows a top view of a number of N⁻ wells formed in a P⁻ epitaxial silicon layer.

Refer now to FIGS. 1-4B of the drawings for a description of the preferred embodiments of this invention. FIG. 1 shows a top view of a number of N⁻ wells 12 formed of N⁻ type silicon in a P⁻ type silicon substrate 10. Typically, but not necessarily, the P⁻ type silicon substrate 10 is a P⁻ type epitaxial silicon layer. FIG. 1 shows four N⁻ wells 12 as an example however the actual number will be larger or smaller, typically smaller, arranged in an array. Each N⁻ well 12 forms a PN junction diode with the surrounding P⁻ silicon material. The N⁻ wells 12 are biased such that the potential of the N⁻ wells 12 are higher than the P⁻ silicon material 10 and the PN junction is back biased. This back biased PN junction forms a pixel which can accumulate carriers generated by an external signal to be read during a readout period. Typically, but not necessarily, the external signal is optical radiation and the carriers are photo-generated carriers.

Figure 2A:
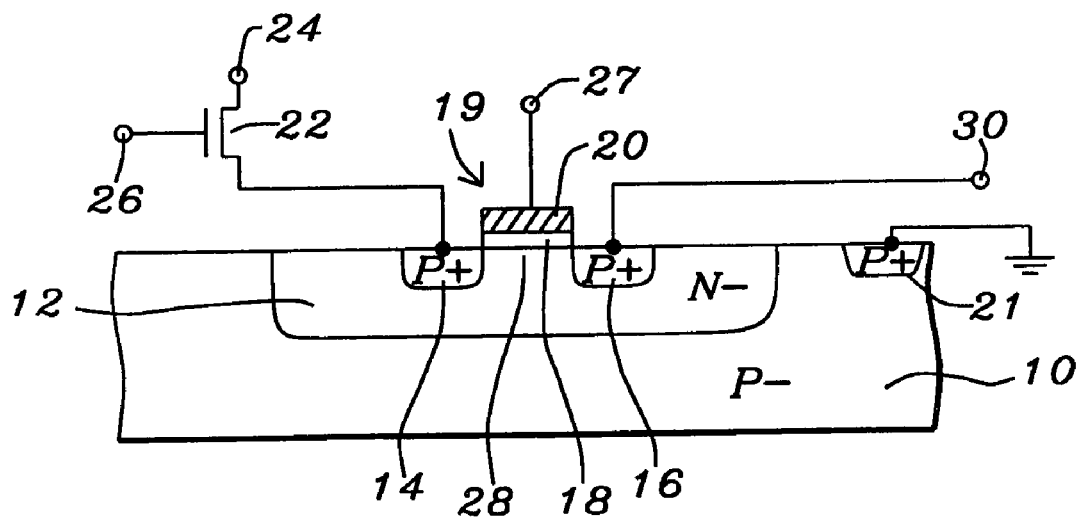
FIG. 2A shows a cross section view of an N⁻ well pixel with a PMOS transistor formed therein and a schematic view of an NMOS transistor used to read the pixel.

FIG. 2A shows a cross section view of one of the N⁻ wells 12 and the surrounding P⁻ silicon material 10. As shown in FIG. 2A, a first P⁺ type silicon region 14 and a second P⁺ type silicon region 16 are formed in the N⁻ well 12. The first P+ type silicon region 14 forms the source and the second P+ type silicon region 16 forms the drain of a PMOS, P channel metal oxide semiconductor, transistor 19. A gate oxide 18 is formed over the channel 28 of the PMOS transistor 19. A gate electrode 20 is formed on the gate oxide 18. The N− well 12 is biased at the highest potential in the circuit when the pixel is reset. This will allow the N− well 12 region to collect all the signal-generated electrons within a diffusion length of the N− well 12 and P− substrate junction. Biasing the N− well 12 at the highest potential in the circuit during reset allows a circuit tolerant to a 100% fill factor for the pixel. In this example the highest potential in the circuit is the $V_{DD}$ potential and is between about 4.5 and 5.5 volts, usually 5.0 volts. As shown in FIG. 2 the P− substrate is held at ground potential by means of a P+ contact 21 into the P− substrate which is held at ground potential. Either the first P+ region 14 or the second P+ region 16 can be used to reset the pixel by raising the potential of the selected P+ region to $V_{DD}$ while the pixel is being reset and then returning the selected P+ region to ground potential while the pixel is accumulating signal-generated electrons.

Figure 2B:
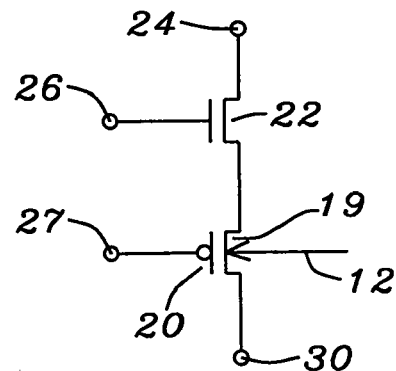
FIG. 2B shows a schematic view of the circuit of FIG. 2A.

FIGS. 2A and 2B show a circuit for reading and resetting the pixel using a single NMOS, N channel metal oxide semiconductor, transistor 22 per pixel. Like reference numbers are used to denote like circuit elements in FIGS. 2A and 2B. As shown in FIG. 2A, the drain of the NMOS transistor 22 is connected to an output node 24 and the source of the NMOS transistor 22 is connected to the source 14 of the PMOS transistor 19. The drain 16 of the PMOS transistor 19 is connected to a reset node 30. The gate of the NMOS transistor 22 is connected to a select node 26. During pixel reset the NMOS transistor 22 is turned off and the reset node 30 is raised from ground potential to a potential of $V_{DD}$ to reset the pixel. This sets the potential of the pixel to $V_{DD}-V_{PB}$ where $V_{PB}$ is the potential drop across the junction between the drain 16 of the PMOS transistor and the N− well. The NMOS transistor is turned on and off by means of a potential applied to the select node 26. After the reset of the pixel has been completed the reset node 30 is returned to ground potential and the NMOS transistor 22 remains turned off while the pixel accumulates signal-generated carriers. Since the source 14 of the PMOS transistor 19 is floating and the drain 16 of the PMOS transistor 19 is at ground potential during the charge accumulation period the PMOS within the N− well 12 will not impact the collection of the signal-generated carriers by the pixel. After the accumulation period has been completed the NMOS transistor is turned on and the charge accumulated by the pixel can be read by detecting the signal at the output node 24.

Alternatively the drain 16 of the PMOS transistor 19 can be permanently connected to ground potential by holding the reset node 30 at ground potential. This has the advantage of eliminating the need for a separate reset line to be bussed to the pixel. In this configuration during reset the NMOS transistor 22 is turned on and the output node 24 is set to $V_{DD}$. This brings the source 14 of the PMOS transistor 19 to very nearly $V_{DD}$ potential thereby resetting the pixel. After the pixel has been reset the NMOS transistor is turned off while the pixel accumulates signal-generated carriers. As before, since the source 14 of the PMOS transistor 19 is floating and the drain 16 of the PMOS transistor 19 is at ground potential during the charge accumulation period, the PMOS within the N− well 12 will not impact the collection of the signal-generated carriers by the pixel. After the accumulation period has been completed the charge accumulated by the pixel is read. One method of reading the pixel is to turn the NMOS transistor on and detect the charge accumulated by the pixel at the output node 24.

The potential of the N− well 12 and the floating PMOS source 16 will change based on the amount of signal-generated carriers accumulated by the pixel during the charge accumulation period. For readout of the accumulated charge the body effect can be utilized to form a dual gate PMOS transistor 19 using the PMOS transistor 19 as a source follower. This is shown schematically in FIG. 2B showing the NMOS transistor 22 having a source connected to the output node 24 and the gate connected to a select node 26. The reset node 30 is either connected to ground or used for resetting the pixel. The N− well 12 forms a second gate for the dual gate PMOS transistor 19 since the potential of the N− well 12 affects the conductivity of the channel 28 of the PMOS transistor 19, see FIG. 2A. The gate 20 of the PMOS transistor 19 can be used as a gain control in this case.

Figure 3A:
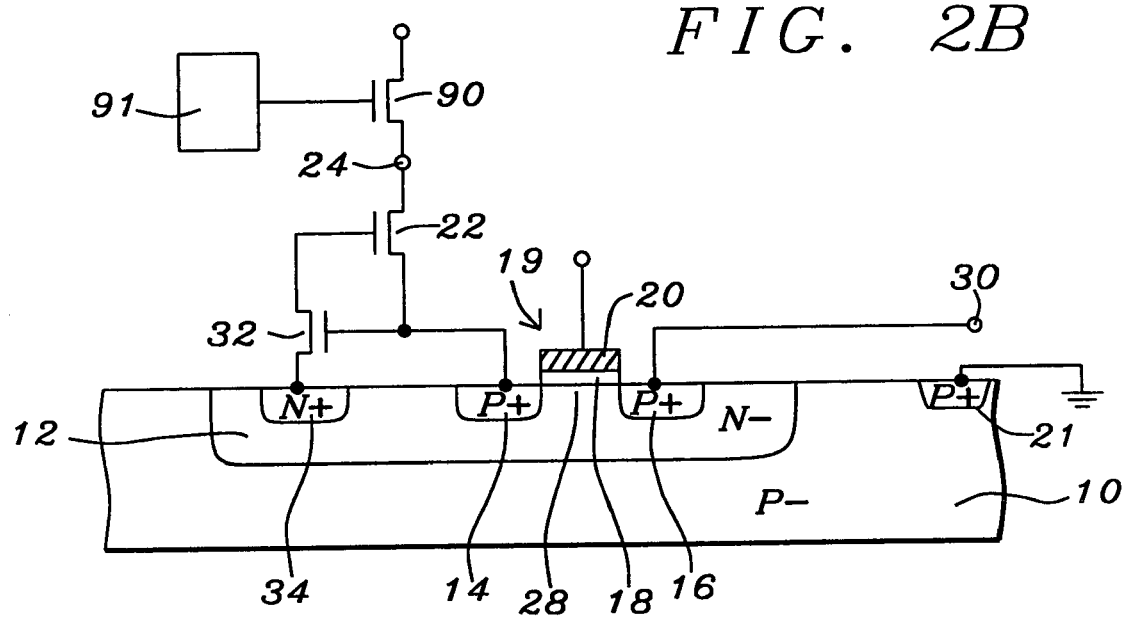
FIG. 3A shows a cross section view of an N⁻ well pixel with a PMOS transistor and an N⁺ region formed therein and a schematic view of a two NMOS transistor circuit used to read the pixel.
Figure 3B:
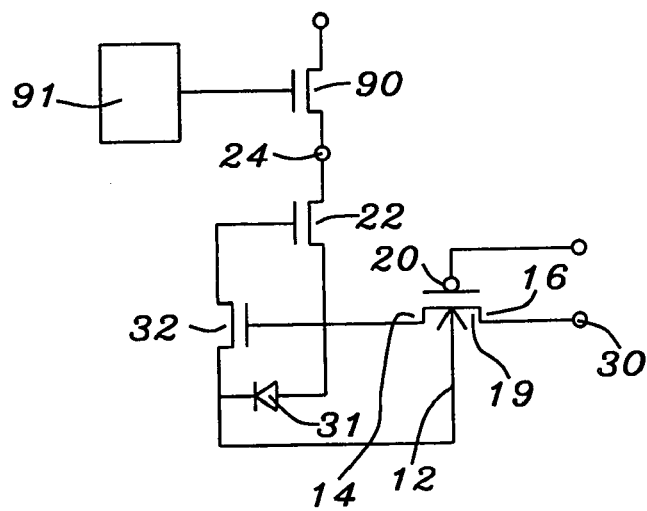
FIG. 3B shows a schematic view of the circuit of FIG. 3A.

There are several readout circuits that can be used with the pixel with the embedded gate PMOS transistor 19 of this invention. FIGS. 3A and 3B show an example of one of these circuits. Like reference numbers are used to denote like circuit elements in FIGS. 3A and 3B. In this example as in the previous example, as shown in FIG. 3A, a first P+ region 14 forms the source and a second P+ region 16 forms the drain of a PMOS transistor 19 formed in the N− well 12. The N− well is formed in a P− substrate 10. A gate oxide 18 is formed over the channel 28 of the PMOS transistor 19 and a gate electrode 20 is formed on the gate oxide 28. The drain 16 of the PMOS transistor 19 is connected to a reset node 30, and the P− substrate 10 is held at ground potential by means of a P+ contact 21 in the P− region 10. As in the previous example, the source of a first NMOS transistor 22 is connected to the source 14 of the PMOS transistor 19 and the drain of the first NMOS transistor 22 is connected to an output node 24. As shown in FIG. 3A an N+ 34 region is formed in the N− well 12 and connected to the source of a second NMOS transistor 32. The drain of the second NMOS transistor 32 is connected to the gate of the first NMOS transistor. The gate of the second NMOS transistor 32 is connected to the source of the first NMOS transistor 22. The diode 31 in FIG. 3B represents the N+ region 34 and N− well junction 12 in FIG. 3A. The potential at the cathode of the diode 31 is the potential of the N− well and is the signal to be read after the pixel has completed a charge accumulation cycle.

During the reset operation the gate 20 of the PMOS transistor 19 is held at ground potential and the reset node 30 is held at $V_{DD}$ potential. In this example $V_{DD}$ is the highest potential in the circuit and is between about 4.5 and 5.5 volts, typically 5.0 volts. This turns the PMOS transistor 19 on, sets the N− region 12 to a potential of nearly $V_{DD}$, $V_{DD}$ minus a small built in potential, and turns the second NMOS transistor 32 on. This built in potential is the potential drop across the P+ source and N− well junction. This also turns first NMOS transistor 22 off since the potential at the gate of the first NMOS transistor 22 is less than the potential at the source of the first NMOS transistor 22. The reset node 30 is then returned to $V_{DD}$ potential turning the PMOS transistor 19 off to begin charge integration. If the potential of the gate 20 of the PMOS transistor 19 is modulated the charge conversion gain can be varied. The second NMOS transistor 32 remains on, because the forward bias remains greater than the threshold voltage. The first NMOS transistor 22 remains off because the potential at the gate of the first NMOS transistor 22 remains less than the potential at the source of the first NMOS transistor 22. Since the first NMOS transistor 22 is off during the reset operation the potential of the output node 24 does not matter.

After the pixel has been reset the signal-generated carriers will reduce the potential of the N⁻ well 12 and the floating source 14 of the PMOS transistor 19. When the pixel is read the potential of the gate 20 of the PMOS transistor 19 is ramped from $V_{DD}$ to ground potential. When the potential of this gate 20 becomes less than the potential at the source 14 of the PMOS transistor 19 minus the threshold voltage of the second NMOS transistor 32 the PMOS transistor 19 turns on. This will pull the potential of the source 14 of the PMOS transistor 19 down to ground potential and reverse bias the diode 31, see FIG. 3B. This causes the second NMOS transistor 32 to turn off and the signal level, the potential of the N⁻ well 12, is stored at the gate of the first NMOS transistor 22. During the readout cycle the gate 20 of the PMOS transistor 19 can be used as a gain adjust control.

The ramping of the potential of the gate 20 of the PMOS transistor 19 can be used to detect the pixel signal level, the potential of the N⁻ well, and can also be used in conjunction with a timer for a basic analog to digital converter. The timer is started at the time the potential at the gate 20 of the PMOS transistor 19 begins to ramp from $V_{DD}$ toward ground potential. The time at which the PMOS transistor turns on is a digital representation of the signal detected by the pixel. This time can be stored for future use. If the pixels are arranged in an array of rows and columns with a global timer is at the bottom of each column, the times at which the PMOS transistor in each pixel of a selected row turns on stored gives a digital representation of the signal and forms a basic analog to digital converter.

Since the potential of the N⁻ well 12 is stored at the gate of the first NMOS transistor 22 a snapshot imager with in pixel storage can be realized with the addition of a third NMOS transistor 90 with the gate of the third NMOS transistor 90 connected to a sequential row addressing circuit 91 and the source of the third NMOS transistor 90 connected to the output node 24. Since the gate of the first NMOS transistor 22 stores the potential of the N⁻ well 12 in a non destructive fashion, an array of rows and columns of pixels can integrate for an identical time duration and store individual pixel signals at the gate of the first NMOS transistor 22 of each pixel in the array. Using the third NMOS transistor 90 as a readout transistor having a gate connected to a sequential row addressing circuit 91 each row can be selectively read out through a single output using a raster scan.

Figure 4A:
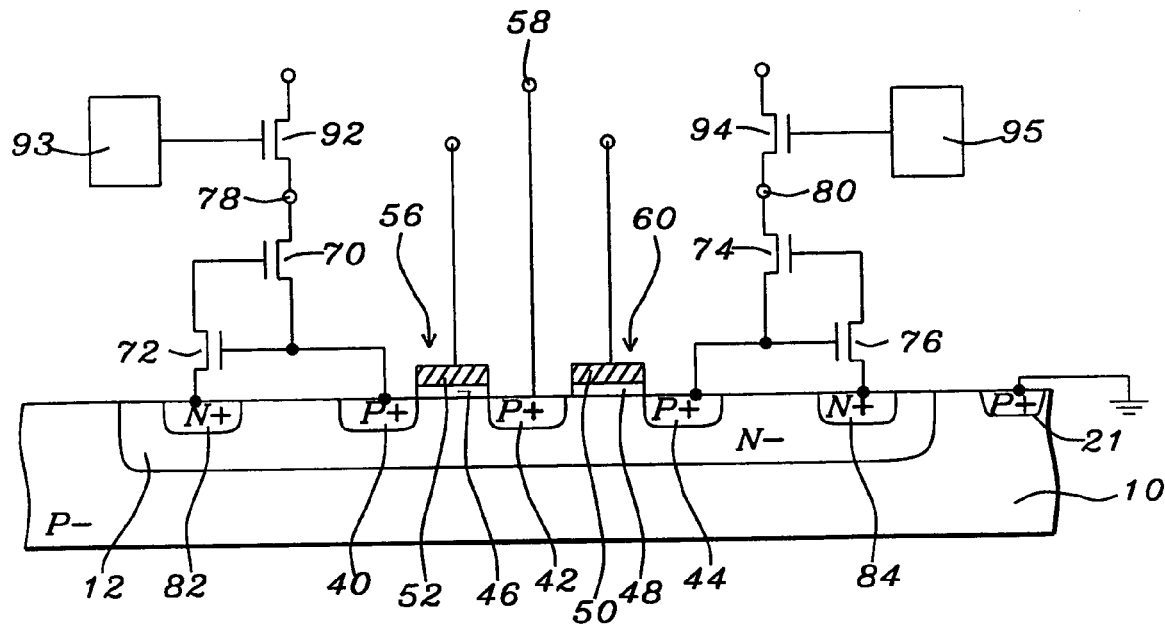
FIG. 4A shows a cross section view of an N– well pixel with two PMOS transistors formed therein and a schematic view of four NMOS transistors used to read the pixel.
Figure 4B:
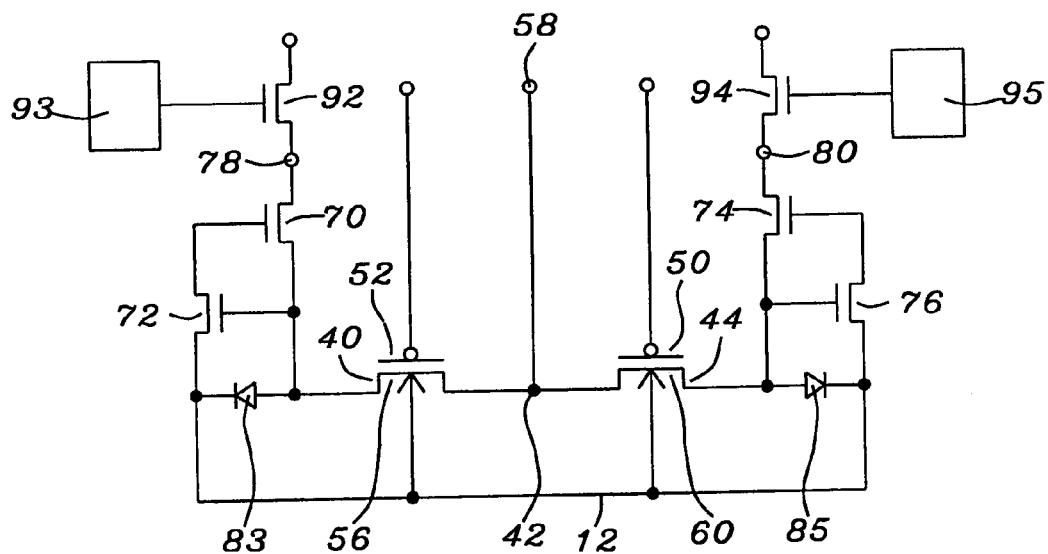
FIG. 4B shows a schematic view of the circuit of FIG. 4A.

This basic circuit block can be repeated and used for on pixel correlated double sampling, CDS. This embodiment is shown in FIGS. 4A and 4B. Like reference numbers are used to denote like circuit elements in FIGS. 4A and 4B. FIGS. 4A and 4B show two dual gate PMOS transistors in a single N⁻ well. As shown in FIG. 4A, a first P⁺ type silicon region 40, a second P⁺ type silicon region 42, and a third P⁺ type silicon region 44 are formed in the N⁻ well 12. The first P⁺ type silicon region 40 forms the source of a first PMOS transistor 56 and the third P⁺ type silicon region 44 forms the source of a second PMOS transistor 60. The second P⁺ region 42 forms the drain of both the first PMOS transistor 56 and the second PMOS transistor 60. A first gate oxide 46 and first gate electrode 52 are formed over the channel of the first PMOS transistor 56. A second gate oxide 48 and second gate electrode 50 are formed over the channel of the second PMOS transistor 60. As in previous embodiments, the N⁻ well 12 is biased at the highest potential in the circuit when the pixel is reset. This will allow the N⁻ well 12 region to collect all the signal-generated electrons within a diffusion length of the N⁻ well 12 and P⁻ substrate junction. In this example the highest potential in the circuit is the $V_{DD}$ potential. In this example $V_{DD}$ is between 4.5 and 5.5 volts, usually 5.0 volts. As shown in FIG. 4A the P⁻ substrate is held at ground potential by means of a P⁺ contact 21 into the P⁻ substrate which is held at ground potential. The pixel is reset by raising the potential of the reset node 58, connected to the second P⁺ region 42, 58, to $V_{DD}$ while the pixel is being reset and then returning the reset node 58 to ground potential while the pixel is accumulating signal-generated electrons.

The second P⁺ region 42, which forms a common drain of the first 56 and second 60 PMOS transistors, is connected to the reset node 58, and the P⁻ substrate 10 is held at ground potential by means of a P⁺ contact 21 in the P⁻ region 10. The source of a first NMOS transistor 70 is connected to the source 40 of the first PMOS transistor 56 and the drain of the first NMOS transistor 70 is connected to a first output node 78. As shown in FIG. 4A a first N⁺ region 82 is formed in the N⁻ well 12 and connected to the source of a second NMOS transistor 72. The drain of the second NMOS transistor 72 is connected to the gate of the first NMOS transistor 70. The gate of the second NMOS transistor 72 is connected to the source of the first NMOS transistor 70. The source of a third NMOS transistor 74 is connected to the source 44 of the second PMOS transistor 60 and the drain of the third NMOS transistor 74 is connected to a second output node 80. As shown in FIG. 4A a second N⁺ region 84 is formed in the N⁻ well 12 and connected to the source of a fourth NMOS transistor 76. The drain of the fourth NMOS transistor 76 is connected to the gate of the third NMOS transistor 74. The gate of the fourth NMOS transistor 76 is connected to the source of the third NMOS transistor 74.

FIG. 4B shows a schematic diagram of the circuit shown in FIG. 4A for easier understanding of the operation of the circuit of FIGS. 4A and 4B. A first diode 83 in FIG. 4B represents the first N⁺ region 28 and N⁻ well 12 junction in FIG. 4A. A second diode 85 in FIG. 4B represents the second N⁺ region 84 and N⁻ well 12 junction in FIG. 4A. The potential at the cathodes of the first diode 83 and second diode 85 is the potential of the N⁻ well and is the signal to be read after the pixel has completed a charge accumulation cycle.

During the reset operation the potentials of the first gate 52 of the first PMOS transistor 56 and the second gate 50 of the second PMOS transistor 60 are set at ground potential while the potential of the reset node 58 is raised from ground potential to $V_{DD}$. After the reset has been completed the potential at the second gate 50 is raised to $V_{DD}$ while potential of reset node 58 remains at $V_{DD}$ and the potential of the first gate 52 remains at ground. This stores the reference voltage on the PN junction between the N⁻ well 12 and the P⁻ substrate 10 the at the gate of the third NMOS transistor 74. The potential of the reset node 58 is then returned to ground potential with the potential at the second gate 50 held at $V_{DD}$ and the charge integration cycle begins. During the charge integration cycle the voltage across the PN junction between the N⁻ well and the P⁻ substrate decreases and the potential of the first gate 52 increases as charge is accumulated. At the end of the charge integration cycle the potential of the second gate 50 is returned to ground potential, the reset node 58 remains at ground potential and the voltage across the PN junction between the N⁻ well 12 and the P⁻ substrate 10, from which the signal generated charge can be determined, is stored at the gate of the first NMOS transistor 70. The difference in potential between the second output node 80 and the first output node 78 gives an image signal with reduced noise and reduced pixel to pixel non-uniformity to accomplish on pixel correlated double sampling, CDS.

As in the previous example, since the potentials at the gates of the first 70 and third 74 NMOS transistors are stored in a non destructive fashion a snapshot imager with in pixel storage can be realized with the addition of a fifth NMOS transistor 92, with the gate of the fifth NMOS transistor 92 connected to a sequential row addressing circuit 93 and the source of the fifth NMOS transistor 92 connected to the first output node 78, and a sixth NMOS transistor 94, with the gate of the sixth NMOS transistor 94 connected to a sequential row addressing circuit 95 and the source of the sixth NMOS transistor 94 connected to the second output node 80, as shown in FIGS. 4A and 4B. As in the previous example, an array of rows and columns of pixels can integrate for an identical time duration and store individual pixel signals at the gates of the first 70 and third 74 NMOS transistors of each pixel in the array. Using the fifth 92 and sixth 94 NMOS transistors as readout transistors having their gates connected to a sequential row addressing circuits, 93 and 95, each row can be selectively read out using a raster scan.

In this invention an N⁻ well formed in a P⁻ substrate is used to form the junction for accumulating signal generated carriers. Those skilled in the art will readily recognize that the invention will work equally well using a P⁻ well in an N⁻ substrate. In this case P⁺ regions are replaced by N⁺ regions, N⁺ regions are replaced by P⁺ regions, P⁻ regions are replaced by N⁻ regions, N⁻ regions are replaced by P⁻ regions, P regions are replaced by N regions, N regions are replaced by P regions, PMOS transistors are replaced by NNOS transistors, NMOS transistors are replaced by PMOS transistors, and the highest voltage in the circuit is replaced by the lowest voltage in the circuit.

While the invention has been particularly shown and described with reference to the preferred embodiments thereof, it will be understood by those skilled in the art that various changes in form and details may be made without departing from the spirit and scope of the invention.

What is claimed is:

1. A pixel circuit, comprising:
    a P⁻ silicon substrate;
    an N⁻ well formed in said P⁻ silicon substrate, wherein said N⁻ well in said P⁻ substrate forms a PN junction which can accumulate signal-generated charge;
    a first P⁺ region and a second P⁺ region formed in said N⁻ well;
    a PMOS transistor having a source, a drain, a channel, and a gate formed in said N⁻ well, wherein said first P⁺ region forms said source, said second P⁺ region forms said drain, and that part of said N⁻ well between said first P⁺ region and said second P⁺ region forms said channel of said PMOS transistor; and
    a gate oxide formed over said channel of said PMOS transistor;
    an electrode formed on said gate oxide over said channel of said PMOS transistor, wherein said electrode forms said gate of said PMOS transistor;
    a first NMOS transistor having a drain connected to an output node, a gate, and a source connected to said source of said PMOS transistor;
    an N⁺ region formed in said N⁻ well; and
    a second NMOS transistor having a source connected to said N⁺ region formed in said N⁻ well, a drain connected to said gate of said first NMOS transistor, and a gate connected to said source of said first NMOS transistor.

2. The pixel circuit of claim 1 wherein said signal-generated charge is photo-generated charge.

3. The pixel circuit of claim 1 wherein said first P⁺ region and said second P⁺ region are held at a potential lower than the N⁻ well potential when said junction between said N⁻ well and said P⁻ silicon substrate is accumulating said signal-generated charge.

4. The pixel circuit of claim 1 wherein said junction between said N⁻ well and said P⁻ silicon substrate is reset by bringing said first P⁺ region to the highest potential in the pixel circuit.

5. The pixel circuit of claim 1 wherein said gate of said PMOS transistor is held at ground potential, said drain of said PMOS transistor is held at the highest potential in the pixel circuit, said PMOS transistor is turned off, said first NMOS transistor is turned on, and said second NMOS transistor is turned off when said junction between said N⁻ well and said P⁻ silicon substrate is being reset.

6. The pixel circuit of claim 1 wherein said drain of said PMOS transistor is held at ground potential, said PMOS transistor is turned off, said first NMOS transistor is turned on, and said second NMOS transistor is turned off when said junction between said N⁻ well and said P⁻ silicon substrate is accumulating signal-generated charge.

7. The pixel circuit of claim 1 wherein the potential of said gate of said PMOS transistor is ramped from the highest potential in the pixel circuit to ground potential when said signal-generated charge accumulated at said junction between said N⁻ well and said P⁻ silicon substrate is being read.

8. The pixel circuit of claim 1 wherein after said signal-generated charge accumulated at said junction between said N⁻ well and said P⁻ silicon substrate has been read a potential proportional to said signal-generated charge accumulated at said junction between said N⁻ well and said P⁻ silicon substrate is stored at said gate of said first NMOS transistor.

9. The pixel circuit of claim 1, further comprising:
    a third NMOS transistor having a source connected to said output node; and
    a sequential row addressing circuit connected to said gate of said third NMOS transistor.

* * * * *